(12) United States Patent
Sinha et al.

(10) Patent No.: US 9,570,271 B2
(45) Date of Patent: Feb. 14, 2017

(54) BORON-CONTAINING DOPANT COMPOSITIONS, SYSTEMS AND METHODS OF USE THEREOF FOR IMPROVING ION BEAM CURRENT AND PERFORMANCE DURING BORON ION IMPLANTATION

(71) Applicants: Ashwini K. Sinha, East Amherst, NY (US); Stanley M. Smith, Clarence Center, NY (US); Douglas C. Heiderman, Akron, NY (US); Serge M. Campeau, Lancaster, NY (US)

(72) Inventors: Ashwini K. Sinha, East Amherst, NY (US); Stanley M. Smith, Clarence Center, NY (US); Douglas C. Heiderman, Akron, NY (US); Serge M. Campeau, Lancaster, NY (US)

(73) Assignee: PRAXAIR TECHNOLOGY, INC., Danbury, CT (US)

( * ) Notice: Subject to any disclaimer, the term of this patent is extended or adjusted under 35 U.S.C. 154(b) by 27 days.

(21) Appl. No.: 14/635,413

(22) Filed: Mar. 2, 2015

(65) Prior Publication Data

US 2015/0248992 A1    Sep. 3, 2015

Related U.S. Application Data

(60) Provisional application No. 61/947,064, filed on Mar. 3, 2014.

(51) Int. Cl.
*H01J 37/317* (2006.01)
*H01J 37/08* (2006.01)

(52) U.S. Cl.
CPC ............ *H01J 37/3171* (2013.01); *H01J 37/08* (2013.01); *H01J 2237/0473* (2013.01); *H01J 2237/08* (2013.01); *H01J 2237/31701* (2013.01)

(58) Field of Classification Search
CPC .... H01J 37/08; H01J 37/3171; H01J 37/3174; H01J 2237/0473; H01J 2237/08; H01J 2237/31701; H01L 21/265; C23C 14/14; C23C 14/16; C23C 14/18
See application file for complete search history.

(56) References Cited

U.S. PATENT DOCUMENTS

| | | |
|---|---|---|
| 5,061,322 A | 10/1991 | Asano |
| 5,937,895 A | 8/1999 | Le Febre et al. |
| 5,940,724 A | 8/1999 | Warren |
| 6,007,609 A | 12/1999 | Semerdjian et al. |
| 6,045,115 A | 4/2000 | Martin, Jr. et al. |

(Continued)

*Primary Examiner* — David E Smith
(74) *Attorney, Agent, or Firm* — Nilay S. Dalal

(57) ABSTRACT

A novel composition, system and method thereof for improving beam current during boron ion implantation are provided. The boron ion implant process involves utilizing B2H6, BF3 and H2 at specific ranges of concentrations. The B2H6 is selected to have an ionization cross-section higher than that of the BF3 at an operating arc voltage of an ion source utilized during generation and implantation of active hydrogen ions species. The hydrogen allows higher levels of B2H6 to be introduced into the BF3 without reduction in F ion scavenging. The active boron ions produce an improved beam current characterized by maintaining or increasing the beam current level without incurring degradation of the ion source when compared to a beam current generated from conventional boron precursor materials.

18 Claims, 6 Drawing Sheets

Ionization cross-section for B2H6 and BF3 at different energy levels

(56) References Cited

U.S. PATENT DOCUMENTS

| | | |
|---|---|---|
| 7,586,109 B2 | 9/2009 | Perel et al. |
| 7,655,931 B2 | 2/2010 | Gupta |
| 7,708,028 B2 | 5/2010 | Brown et al. |
| 7,905,247 B2 | 3/2011 | Campeau |
| 7,943,204 B2 * | 5/2011 | Olander .................. H01J 37/08 427/523 |
| 8,062,965 B2 | 11/2011 | Kaim et al. |
| 8,237,134 B2 * | 8/2012 | Kaim ...................... H01J 37/08 250/423 R |
| 8,389,068 B2 | 3/2013 | Olander et al. |
| 8,522,817 B1 | 9/2013 | Jordan |
| 8,598,022 B2 | 12/2013 | Kaim et al. |
| 2004/0104682 A1 | 6/2004 | Horsky et al. |
| 2005/0230047 A1 * | 10/2005 | Collins ............. H01J 37/32082 156/345.33 |
| 2006/0081558 A1 | 4/2006 | Collins et al. |
| 2008/0054194 A1 * | 3/2008 | Kim .................. H01J 37/32082 250/492.21 |
| 2008/0135817 A1 | 6/2008 | Luly et al. |
| 2010/0200954 A1 | 8/2010 | Del Agua Borniquel et al. |
| 2012/0119113 A1 | 5/2012 | Colvin et al. |
| 2012/0252195 A1 | 10/2012 | Jones et al. |
| 2013/0137250 A1 | 5/2013 | Olander et al. |

* cited by examiner

Ionization cross-section for B2H6 and BF3 at different energy levels

Different delivery schemes

Schematic of an IHC type ion sourc

Schematic of an ion implant system

Relative beam current for different gas mix composition. A: 100% $^{11}BF_3$; B: 2.25%Xe/12.75%$H_2$/85% $^{11}BF_3$; C: 2.5% $B_2H_6$/97.5%$BF_3$; D: 5%$B_2H_6$/95%$^{11}BF_3$; E: 5% $B_2H_6$/5%$H_2$/90% $^{11}BF_3$; F: 3%$B_2H_6$/5%$H_2$ 92% $^{11}BF_3$ Cathode and anode weight gain/loss summary

| Dopant Gas Composition | Cathode weight gain/loss rate | Anode weight gain/loss rate |
|---|---|---|
| $^{11}BF_3$ only | +28.5 mg/hr | – |
| $^{11}BF_3$ + Xe/$H_2$ | +1.43 mg/hr | −0.75 mg/hr |
| 97.5% $^{11}BF_3$ + 2.5% $B_2H_6$ | +0.3 mg/hr | −5.1 mg/hr |
| 90% $^{11}BF_3$ + 5% $B_2H_6$ + 5% $H_2$ | −2.5 mg/hr | −1.1 mg/hr |
| 92% $^{11}BF_3$ + 3% $B_2H_6$ + 5% $H_2$ | −0.6 mg/hr | −0.9 mg/hr |

FIG. 6

BORON-CONTAINING DOPANT COMPOSITIONS, SYSTEMS AND METHODS OF USE THEREOF FOR IMPROVING ION BEAM CURRENT AND PERFORMANCE DURING BORON ION IMPLANTATION

RELATED APPLICATIONS

This application claims priority from U.S. application Ser. No. 61/947,064, filed on Mar. 3, 2014, which is hereby incorporated by reference in its entirety.

FIELD OF INVENTION

The present invention relates to a unique combination of boron-containing dopant compositions, systems and methods of use thereof for improved boron ion implant processes, and particularly an improved beam current.

BACKGROUND OF THE INVENTION

Ion implantation is an important process in semiconductor/microelectronic manufacturing. The ion implantation process is used in integrated circuit fabrication to introduce dopant impurities into semiconductor wafers. The desired dopant impurities are introduced into semiconductor wafers to form doped regions at a desired depth. The dopant impurities are selected to bond with the semiconductor wafer material to create electrical carriers and thereby alter the electrical conductivity of the semiconductor wafer material. The concentration of dopant impurities introduced determines the electrical conductivity of the doped region. Many impurity regions are necessarily created to form transistor structures, isolation structures and other electronic structures, which collectively function as a semiconductor device.

The dopant impurities are generally ions derived from a source dopant gas. An ion-source filament is used to ionize the dopant gas source into the various dopant ionic species. The ions produce a plasma environment within the ion chamber. The ions are subsequently extracted from the ion chamber in the form of a defined ion beam. The resultant ion beam is typically characterized by a beam current. Generally speaking, a higher beam current can allow more dopant ionic species to be available for implantation into a given workpiece, such as a wafer. In this manner, a higher implant dosage of the dopant ionic species can be achieved for a given flow rate of source dopant gas. The resultant ion beam may be transported through a mass analyzer/filter and then transported to the surface of a workpiece, such as a semiconductor wafer. The desired dopant ionic species of the beam penetrate the surface of the semiconductor wafer to form a doped region of a certain depth with desired electrical and/or physical properties.

Boron implantation has been widely used in the semiconductor industry to modify electrical properties of the doped regions and is recently gaining traction in other applications where desired regions are doped with impurities to tailor physical properties of the doped region. The increasing use for boron implant steps during device fabrication is requiring a need for an improved process for implantation of B ions that can offer improved B+ beam current (i.e., sustained or increased beam current generated without shortened ion source life). It should be understood that the terms "B ions", "B ionic species", "B ionic dopant species" and "B+ ions" will be used interchangeably herein and throughout the specification. The ability to implant B ions at an improved B+ beam current will allow end-users to perform increasing boron implant steps with higher equipment throughput and gain productivity improvements.

Boron trifluoride (BF3) is a dopant gas source typically utilized in the semiconductor industry for boron implantation. However, BF3 has proven limited in its ability to generate B+ ions and thereby establish the higher beam currently demanded by today's applications. In order to increase the generation of B+ ions, the end-user can change various process parameters. For example, the end-user can increase the energy inputted to the ion source, otherwise referred to in the industry as the operating arc voltage of the ion source. Alternatively, the extraction current can be increased. Still further, the flow rate of BF3 introduced into the ion source chamber can be increased. However, such changes in the operation of the ion implant chamber can result in detrimental impact on the ion source components and reduce the ion source lifetime as well as the efficiency of the ion source of generating stable B+ ion beam during its extended operation. A stable B+ ion beam is defined by the uniform beam profile and continuous supply of the B+ beam at a desired beam current without interruption that may be caused by beam glitching or drop in beam current output. For example, as the walls of the arc chamber increase in temperature during a typical ion implant process, active fluorine that is released from BF3 can more rapidly etch and erode the tungsten chamber walls, which can cause the cathode to be more susceptible to increased deposition of W-containing deposits. The W-containing deposits reduce the ion source's ability to generate the threshold number of electrons necessary to sustain the plasma and generate B+ ions. Additionally, more active fluorine ions are available to propagate the so-called detrimental "halogen cycle" by which increased chemical erosion of the ion source chamber wall and other chamber components can occur. Accordingly, operating the ion source chamber at higher energy levels in an attempt to increase ionization of BF3 has the potential for shorter ion-source life, thereby rendering this mode of operation undesirable. Additionally, higher flow rates of BF3 tends to produce more active fluorine ions that causes chemical erosion of the ion source chamber wall and undesirable deposition on high voltage components resulting in arcing. These process modifications tend to shorter ion-source life, thereby making such modes of operation undesirable.

Currently, there are no viable techniques for maintaining or increasing the beam current of B+ ion without damaging the ion source chamber components. As such, there remains an unmet need to develop compositions, systems and methods of use thereof to improve the beam current of the desired boron ion species without compromising the ion source life.

SUMMARY OF THE INVENTION

The invention relates, in part, to a composition, system and method of use thereof for improving ion source performance, including an increase in beam current and extension of ion source life. The composition of the dopant gas has been discovered by Applicants to have a significant impact on the ability to improve beam current.

In a first aspect, a dopant gas composition is provided. The composition comprises a boron-containing dopant gas composition comprising diborane (B2H6) at a level ranging from about 0.1%-10%, $H_2$ ranging from about 5%-15% and the balance is $BF_3$. The $B_2H_6$ is selected to have an ionization cross-section higher than that of said BF3 at an operating arc voltage of an ion source utilized during generation and implantation of active boron ions. The boron-containing dopant gas composition increases boron ion beam current and extends ion source life in comparison to a beam current generated from boron trifluoride (BF3).

In a second aspect, a system for providing an improved beam current during boron ion implantation is provided. An ion source apparatus is provided. The apparatus is partially defined by an arc chamber wall, wherein the chamber comprises a boron ion source disposed at least partially within the chamber wall. One or more supply vessels in fluid communication with said ion source apparatus is provided. The vessels store a boron-containing dopant gas composition. The composition comprises B2H6 at a level ranging from about 0.1%-10%, $H_2$ ranging from about 5%-15% and the balance being $BF_3$. The B2H6 is selected to have an ionization cross-section higher than that of said BF3 at an operating arc voltage of an ion source utilized during generation and implantation of active boron ions. One or more supply feed lines corresponding to the one or more supply vessels is provided whereby said feed lines are extending from the one or more supply vessels through the wall into the chamber. The one or more vessels are configured to dispense said boron-containing dopant composition through said supply feed lines and into said ion source apparatus thereby allowing the boron-containing composition to ionize and thereby generate active boron ions. The active boron ions produce an increased beam current in comparison to a beam current generated solely from BF3.

In a third aspect, a method for increasing a quality of an ion beam current during boron ion implantation is provided. A boron-containing dopant composition comprises B2H6 at a level ranging from about 0.1%-10%, $H_2$ ranging from about 5%-15% and the balance being $BF_3$. The boron-containing dopant composition is introduced into an ion source chamber. The B2H6 and BF3 are ionized at a predetermined operating arc voltage at which said B2H6 has an ionization cross-section higher than that of said BF3. Active boron ions are generated. An increased beam current is produced characterized as having an extended source life in comparison to a beam current generated solely from BF3.

BRIEF DESCRIPTION OF THE DRAWINGS

The objectives and advantages of the invention will be better understood from the following detailed description of the preferred embodiments thereof in connection with the accompanying figures wherein like numbers denote same features throughout and wherein:

FIG. 6 shows cathode weight gain, cathode weight loss, anode weight gain and anode weight loss for different boron-containing dopant gases.

DETAILED DESCRIPTION OF THE INVENTION

Figure 1:
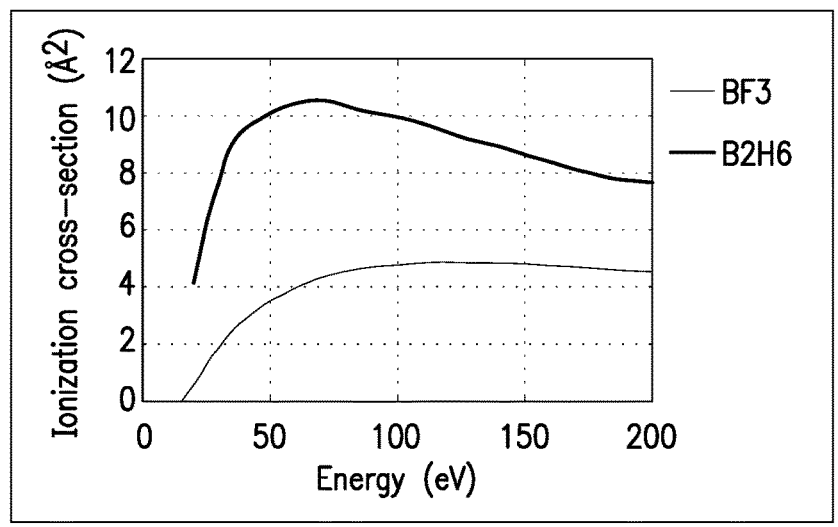
FIG. 1 plots the ionization cross-section for B2H6 and BF3 at different energy levels.

The relationship and functioning of the various elements of this invention are better understood by the following detailed description. The detailed description contemplates the features, aspects and embodiments in various permutations and combinations, as being within the scope of the disclosure. The disclosure may therefore be specified as comprising, consisting or consisting essentially of, any of such combinations and permutations of these specific features, aspects, and embodiments, or a selected one or ones thereof.

"B ions" as used herein and throughout the specification means various boron ion dopant species, including boron or boron-containing positive ions such as B+ suitable for implantation into a substrate.

As used herein, unless indicated otherwise, all concentrations are expressed as volumetric percentages ("vol %") based on the total volume of the composition as a mixture.

"Reduce" as used herein and throughout the specification is intended to mean shorten, suppress and/or delay during operation of the ion implant process when operating an ion implant source to implant B+ ions utilizing the dopant compositions of the present invention.

The present disclosure in one aspect relates to novel boron-containing dopant compositions within a certain concentration range along with corresponding systems, and methods of use thereof for increasing the boron beam current in comparison to conventional boron dopant sources such as BF3. "Ionization cross-section" is defined as the probability (measured in units of area) that ionization will occur when an atom or molecule undergoes collision with an electron emitted from the ion source. The dopant gas composition of the present invention as will be described herein improves the performance of the ion-source in comparison to previous boron dopant source materials without compromising ion source life. Ion source performance takes into consideration key performance metrics that include stability of beam current, source life and the extent of beam glitching. "Beam glitching" as used herein refers to the voltage discharge that can result in momentary drops in the beam current. The disclosure is set out herein in various embodiments and with reference to various aspects and features of the invention.

The present invention has discovered that a specific compositional concentration range of B2H6, BF3 and hydrogen constituents under selective ionization conditions enables an improvement in ion beam current whereby the beam current can be increased without compromising or degrading the ion source. In this manner, an increased boron ion beam current is possible without an accumulation of deposits to an unacceptable level that causes shortening of the source life.

The boron dopant gas composition enables increased beam current for an extended period of time relative to other conventional source dopant gases typically utilized in boron ion implantation. The dopant composition comprises the constituent elements of diborane ($B_2H_6$), boron trifluoride ($BF_3$) and hydrogen ($H_2$) contained in a specific concentration range. In one embodiment, the composition comprises B2H6 ranging from 0.1%-10%, $H_2$ ranging from about 5%-15% and the balance $BF_3$. In a preferred embodiment, the composition comprises B2H6 ranging from 0.1%-5%, $H_2$ ranging from about 5%-10% and the balance $BF_3$. In a more preferred embodiment, the composition comprises B2H6 ranging from 2%-5%, $H_2$ ranging from about 5%-10% and the balance $BF_3$. In a preferred embodiment, the composition comprises B2H6 at about 3%, $H_2$ at about 5% and the balance $BF_3$.

It should be understood that any of the constituent elements of the composition can be isotopically enriched beyond its natural abundance. The term "isotopically enriched" means the dopant gas contains a distribution of mass isotopes different from its naturally occurring isotopic distribution, whereby one of the mass isotopes has an enrichment level higher than present in the naturally occurring level. By way of example, 99% 11BF3 (i.e., 11BF3 as used herein and throughout the specification) refers to an isotopically enriched or enriched dopant gas containing mass isotope 11B at 99% enrichment, whereas naturally occurring BF3 contains mass isotope 11B at 80% natural abundance levels. As such, 99% 11BF3 is 19% enriched in B. Additionally, it should be understood that the dopant compositions of the present invention can contain two or more isotopic forms of one or more of the constituent elements. For example, B2H6 can be present in an amount where each of B11 and B10 is present in their natural abundance or enriched ratio.

The dopant gas composition of the present invention is utilized in an ion implant process at a specific operating regime in which the ionization cross-section of B2H6 is greater than the ionization cross-section of BF3. In this manner, the generation of B+ ions is improved. Referring to FIG. 1, B2H6 exhibits a higher ionization cross-section than BF3 at the selected operating arc voltages of about 80V-100V, and more preferably about 70V-120V. Within this selected operating regime, Applicants have observed that B2H6 has a higher probability of generating various boron-containing ionic species. The presence of the boron-containing ionic species derived from B2H6 augments the ionization process of BF3 resulting in higher B+ beam current without degradation of the source filament (i.e., cathode) of the ion source. The net effect is an improvement in the ion beam performance. This improvement in the ion beam performance is exhibited within the predetermined concentration ranges for B2H6 and H2. B2H6 is within about 0.1%-10%, preferably about 1-5%, more preferably about 2-5% and most preferably about 3%, and the hydrogen concentration is between about 5%-15%, preferably about 5%-10% and most preferably about 5%, with the balance being BF3.

The present invention recognizes that operating the ion implant process in a regime where the ionization cross-section of B2H6 is not greater than the ionization cross-section of BF3 may not create an improvement in the ionization of BF3. As a result, an increase in B+ beam current may not be observed.

The amount of B2H6 can neither be below 0.1% nor above 10% in order to avoid deleterious effects. Specifically, the B2H6 must be present at or above its minimum concentration level to reduce the halogen cycle effects so that the rate of cathode filament weight gain is reduced. When the B2H6 is present at a level below 0.1%, insufficient gains in beam current can be observed in conjunction with unacceptably high cathode weight gains by virtue of the halogen cycle.

In addition to maintaining the B2H6 at or above a lower limit of 0.1%, the B2H6 should not exceed an upper limit. It was surprisingly observed that the addition of B2H6 to BF3 increases the production of F+ ions when B2H6 is at levels only approaching 2.5%, despite there being no increase in the addition of fluorine molecules being introduced into the chamber. As will be shown in the working examples, while it was observed that the addition of a mixture of 2.5% B2H6 and 97.5% BF3 reduced the halogen cycle in comparison to a mixture of BF3–Xe–H2, the mixture of 2.5% B2H6 and 97.5% BF3 created unexpected rapid weight loss in the anode region of the ion source compared to BF3–Xe–H2. The term "anode region" as used herein and throughout the specification means the hottest regions of the ion chamber wall. The unexpected weight loss may be occurring as a result of increased production of F+ ions when B2H6 is present at levels approaching 2.5% or more. Without being bound by any particular theory, it is believed the B2H6 ionizes in the ion source to produce different fragments containing radicals and ions of H and BxHy species, respectively. Both H and BxHy species have been discovered by Applicants to play a role as F ion scavengers. BxHy ions and radicals are significantly bulkier than H ions and radicals, and as a result, may have a tendency to transport more slowly in the plasma phase in comparison to lighter species, including H ions. As a result, BxHy may not transport as easily to all locations in the arc chamber thereby reducing its F ion scavenging effects. The inability of BxHy ionic species to disperse into all regions of the chamber can severely impact the operation of the ion source, as the etched-out W from the surfaces of the chamber components can redeposit at undesirable locations via the increased amounts of fluorine available in the halogen cycle. The result is increased tendency for high voltage arcing. Because BxHy ionic species may not occupy certain regions in the ion chamber in appreciable amounts, or may be entirely absent from certain regions in the chamber, F ion etching may be increasing as a result of lower F ion scavenging by the various BxHy ionic species, thereby resulting in increased availability of active F ions, which shortens the ion source life.

Approaches to overcome reduced F ion scavenging during boron implantation have included the addition of a diluent gas mixture to BF3. For example, co-flowing a gas mixture of Xe and H2 has been utilized. However, the increased scavenging of F ions has been achieved only at the expense of lower beam current in comparison to BF3.

The present invention has discovered that a controlled addition of H2 to B2H6 and BF3 overcomes the deficiencies of F ion scavenging when utilizing BF3 and B2H6, thereby allowing more B2H6 to be added to BF3 without shortening ion source life. For mechanisms that are unknown and not fully understood, the H2, when added within a specific concentration range between about 5%-15%, preferably about 5%-10% and more preferably about 5%, appears to extend ion source life. H2, when added in the prescribed quantities of the present invention, can reduce the availability of active F ions that can etch chamber components. As a result, there is less weight loss of the anode region, and less weight gain of the cathode filament, as will be shown in the working examples. The addition of H2 in a controlled amount to the B2H6 and BF3 allows a greater fraction of B2H6 to be utilized in order to create increased B ion beam current without increased F ion accumulating in the chamber during the ion implant process. As will be shown in the working examples, relative to BF3 only (Comparative Example 1), the preferred compositions (Examples 1 and 2) of the present invention incorporate up to about 5% H2 to achieve 15% higher beam current with reduced weight gain of the cathode and reduced etching of the arc chamber wall. In this manner, the present invention can increase boron ion current while also extending ion source life, both of which until the emergence of the present invention were generally considered competing performance metrics mutually exclusive of one another.

In a preferred embodiment, the inventive mixture of hydrogen, B2H6 and BF3 is characterized by the absence of other inert gases, such as for example argon or xenon. It has been observed that other inert gases may not be required to be added to the inventive mixture of hydrogen, B2H6 and BF3 to aid in the ionization of boron. As such, in the preferred embodiment, the boron-containing composition of the present invention specifically excludes other inert gases, such as xenon or argon. As will shown in the working examples, Applicants discovered that the inventive mixture of hydrogen, B2H6 and BF3, which is characterized by the absence of other inert gases, increased the beam current approximately 30% in comparison to a mixture of BF3+ Xe+H2 (Comparative Example 2).

Figure 2A:
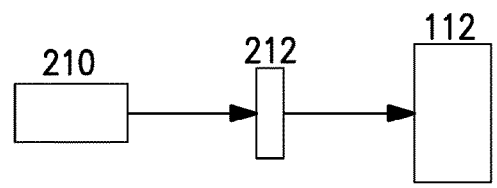
FIGS. 2a, 2b and 2c show different delivery schemes of the dopant gas composition of the present invention.
Figure 2B:
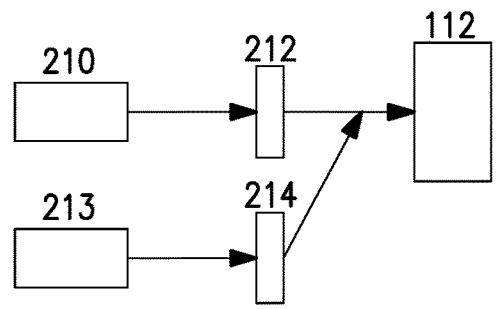
Figure 2C:
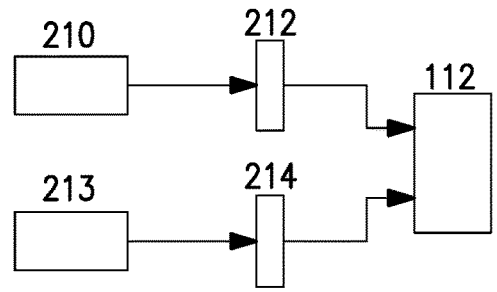

Numerous supply configurations as shown in FIGS. 2a, 2b and 2c can be employed to create the composition of the present invention. In a preferred embodiment, the species can be stored and delivered from a single source as shown in FIG. 2a. Specifically, FIG. 2A shows that the gas composition of the present invention supplied from a single source storage vessel 210 in which the composition is pre-mixed to the concentration levels of the present invention. The single source storage vessel can be stored and delivered using any type of vessel. In a preferred embodiment, a sub-atmospheric Uptime® delivery package can be utilized, as described in U.S. Pat. Nos. 5,937,895; 6,045,115; 6,007,609; 7,708,028; and 7,905,247, all of which are incorporated herein by reference in their entirety. The sub-atmospheric delivery device is designed to maintain the dopant mixture in a pressurized state within the device, while minimizing or eliminating the risk of developing a leak or catastrophic rupture that is typically associated with high pressure cylinders. The device is vacuum actuated so as to allow a controlled flow of the dopant mixture to a downstream process when a sub-atmospheric condition is achieved along the discharge flow path.

When the constituents of the present invention are supplied from a single source, the presence of hydrogen at the prescribed amounts in accordance with the present invention can reduce decomposition of mixtures of B2H6 and BF3 to produce higher order boranes, represented by the general formula BxHy, where x is greater than 2. Some examples of higher order boranes may include B3H9, B5H9, B4H10 or B10H18. Additionally, the chemical stability may be further enhanced by storing the contents at temperatures below ambient conditions, such as in a range from 20 to −30° C. and more preferably from 20 to 4° C.

Alternatively, the dopant composition of the present invention can be created within the ion source chamber by sequentially flowing or co-flowing each of the species. FIG. 2b shows flow control device 212 and 214 can be used to supply a controlled flow of the gas composition and a desired flow from each storage vessel can be premixed in delivery lines before being introduced into the ion source chamber 112. One of the storage vessels may contain one of the constituent gases in pure form. For example, storage vessel 210 contains pure BF3 and storage vessel 213 contains a desired composition of B2H6 and H2 that is pre-mixed. In yet another configuration, FIG. 2c shows the flow from storage vessels 210 and 213 can be separately introduced in the ion source chamber 112 to create the dopant gas composition of the present invention.

Figure 3:
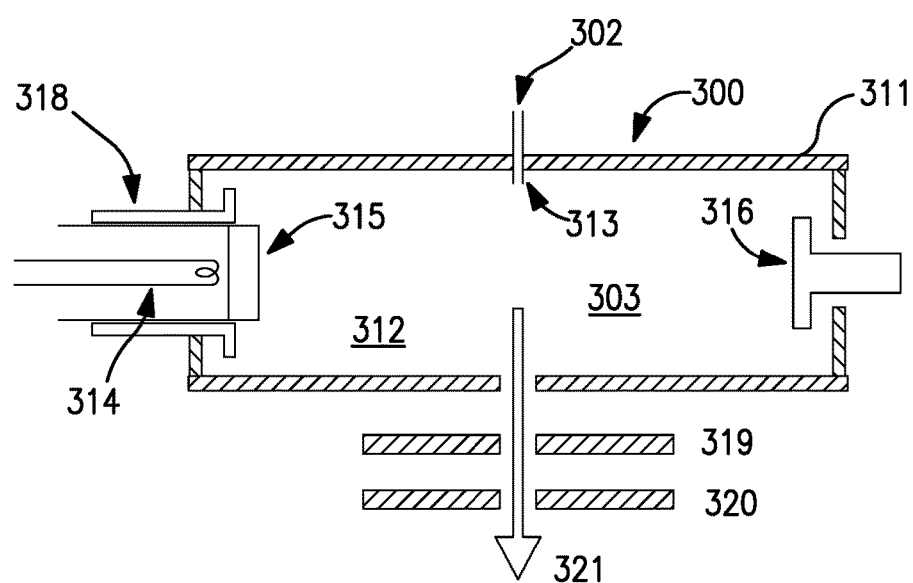
FIG. 3 shows an ion source incorporating the principles of the invention.

Any suitable ion implantation apparatus may be utilized with the present invention. With reference to FIG. 3, a representative ion implantation apparatus 300 is shown for implanting B ions derived from a boron-containing dopant composition of B2H6, BF3 and H2 at the concentration ranges of the present invention. The ion source apparatus 300 depicted in FIG. 3 has various components, including an indirectly heated cathode (IHC) 315, which may serve as the ion source for ionizing the boron-containing dopant gas composition of the present invention into its corresponding boron active ions. It should be understood that the dopant gas composition of the present invention is suitable with other types of ion sources known in the art, including, for example, the Freeman sources, Bernas sources and RF plasma sources.

The ion source apparatus 300 of FIG. 1 can be used for producing an ion beam for implanting boron ions into a semiconductor substrate. The boron ions are generated from ionization of the B2H6 and BF3 in a manner that generates higher boron ion beam current in comparison to a beam current generated solely from BF3. Without being bound by any particular theory, it is believed that under the specific compositional range of the boron-containing dopant composition, and the carefully selected operating conditions of the ion source apparatus 300, the BF3 and B2H6 interact with one another in a synergistic manner to create an ionization mechanism that generates an increased amount of B active ions to produce an increased and improved beam current. "B active ions" as used herein means boron ions having the general formula B+, which is available for implantation.

The dopant gas composition disclosed in the present invention preferably allows the ion source cathode 315 life to be extended compared to conventional boron dopant ion implantation systems, at least in part, on the basis of minimal rate of weight change of the source cathode 315 during the operation of the ion source apparatus 300. The net result is an ion source cathode 315 that is not subject to premature failure, thereby allowing the source cathode 315 to remain operational for an extended period of time to increase throughput. In this manner, the present invention possesses a unique boron-containing dopant gas composition capable of maintaining or increasing boron ion beam current relative to a beam current generated solely from 11BF3 while simultaneously maintaining the integrity of the source filament 315 for a longer duration than previously possible utilizing conventional precursor materials such as 11BF3.

Still referring to the ion source apparatus 300 of FIG. 3, the boron-containing dopant gas composition stream 302 comprises BF3, B2H6 and H2, and is preferably delivered as a single stream contained in a predetermined ratio that is introduced into an ion source chamber 312 through a gas feed line extending through the arc chamber wall 311. The boron-containing dopant gas composition 303 inside the source chamber 312 is subject to ionization by applying a predetermined voltage from a power supply source (not shown) to resistively heat a tungsten-based filament 314 positioned in close proximity to the IHC 315. The filament 314 may be negatively biased relative to the IHC 315. A current is applied to the filament 314 through the power supply source to resistively heat the filament 314. An insulator 318 is provided to electrically isolate the cathode 315 from the arc chamber wall 311.

Electrons are emitted by the cathode 315. The emitted electrons accelerate and ionize the B2H6 and BF3 of the boron-containing dopant composition 303 molecules to produce a plasma environment within the chamber 312. The repeller electrode 316 builds up a negative charge to repel the electrons back to sustain ionization of boron-containing dopant composition 303 molecules, thereby maintaining the plasma environment in the arc chamber 312. Repeller electrodes 316 are preferably configured substantially diametrically opposed to the IHC 315 to maintain ionization of the dopant gas composition 303 within the chamber 312. The arc chamber wall 311 includes an extraction aperture 317 through which a well defined ion beam 321 is extracted from out of the arc chamber 312. The extraction system includes extraction electrode 320 and suppression electrode 319 positioned in front of the extraction aperture 317. Both the extraction and suppression electrodes 320 and 319 have respective apertures aligned with the extraction aperture 317 for extraction of the well-defined ion beam 321 that can be used for boron ion implantation.

Ionization of the boron-containing dopant gas composition 303 may cause generation of a variety of ionized species from a synergistic interaction of each of the constituents of B2H6, BF3 and H2, and any of their corresponding ionic species. Under sufficient operating conditions, including selection of an arc voltage that favorably allows synergistic interaction of B2H6 and BF3 within ion source apparatus 100 by virtue of their corresponding ionization cross-sections at the selected operating arc voltage (FIG. 1) and by controlling the relative amounts of each of the constituents of the boron-containing dopant composition introduced into the ion chamber 312, an increased beam current is produced and sustained for extended periods of time in comparison to conventional boron dopant compositions.

A reduction in the formation of W-containing deposits translates into less diffusion and decomposition of W-containing deposits onto the hotter surfaces of IHC 315. Accordingly, the rate of weight gain of the IHC 315 during operation of the ion source apparatus 300 is substantially reduced as well as the rate of weight loss in the anode region of the chamber. The end result is a lower frequency or elimination of beam glitching, thereby increasing beam stability and extending the operational lifetime of the ion source apparatus 300.

Figure 4:
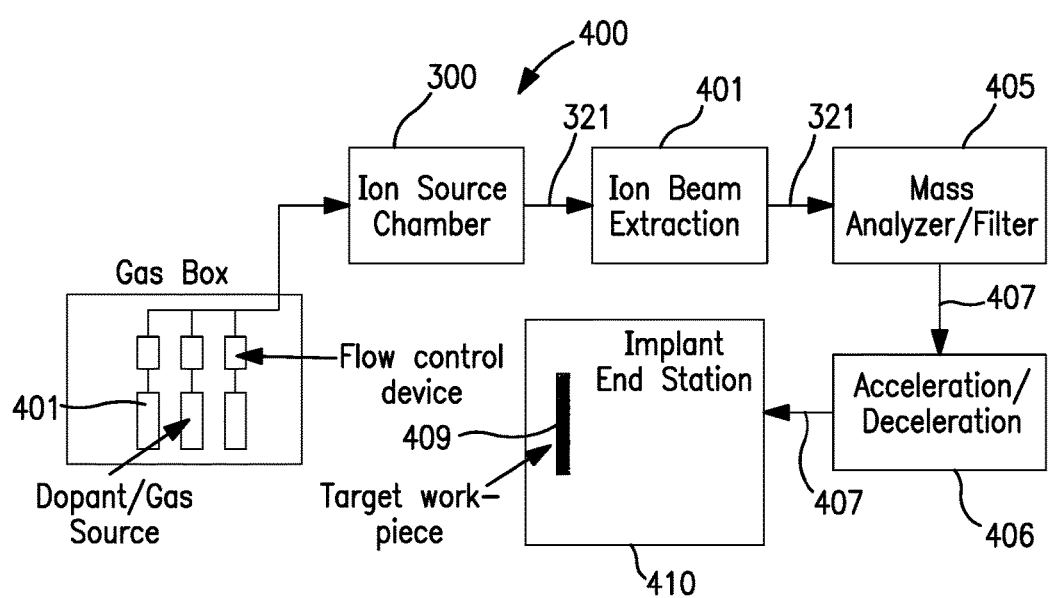
FIG. 4 shows the ion implanter of FIG. 3 within a boron implant system.

FIG. 4 shows the ion source apparatus 100 of FIG. 3 incorporated into ion implant system 400. It should be appreciated by one skilled in the art that that all of the elements of the ion source apparatus 300 of FIG. 3 are incorporated into FIG. 4. As a result, the elements and features of the ion source apparatus 300 shown in FIG. 4 should be understood in relation to the elements and features shown in FIG. 3.

FIG. 4 shows that the dopant gas composition can be supplied form a dopant gas box 401. The dopant gas composition can be provided as a pre-mixed composition in a single supply vessel within gas box 401 at the desired formulation. Alternatively, the gas box 401 may be constructed and arranged such that each of the constituents, B2H6 and BF3, can be supplied in separate dispensing vessels as part of a gas kit which are then co-flowed or sequentially flowed, continuously or semi-continuously, at controlled flow rates utilizing corresponding flow controllers which may be considered part of the gas kit. Hydrogen can be pre-mixed with B2H6. The flow rates of BF3 and B2H6-H2 are controlled and directed towards the ion source apparatus 400 to create the desired boron-containing dopant gas composition at the preferred concentration ranges. Such dopant gas composition can produced at either the inlet to the source chamber 400 and/or therewithin. The location at which the individual constituents mix can occur either upstream of the ion source apparatus 400 or within the chamber 412 of the apparatus 400.

Still referring to FIG. 4, the boron containing dopant gas composition is introduced from box 401 into the ion source apparatus 400 as a pre-mixed single source or as individual species of BF3 and B2H6-H2 in the manner immediately described above in either a co-flown or sequentially flown manner into the apparatus 300. A voltage is applied to ion source filament 314 as a means for introducing energy into the chamber 312 (FIG. 3) to generate the selected arc voltage of apparatus 300 to ionize the boron-containing dopant gas composition and produce a sufficient concentration of active boron ions available for implantation. Preferably, the energy inputted to the ion source 314 (i.e., arc voltage) is maintained in a range of about 80V-120V so as to enable interaction of the constituents and their corresponding ionic species of the inventive dopant composition in a synergistic manner to create an ionization mechanism that generates an increased amount of active B+ ions. A resultant plasma environment within the chamber 312 is produced. The ion beam extraction system 401 includes extraction electrode 320 and suppression electrode 119 that form part of the boron-containing dopant supply system as shown in FIG. 2 and which are configured for extraction of a well-defined boron beam 321 to be used for boron ion implantation. The beam 321 may be transported through an optional mass analyzer/filter 405 to select and magnetically capture the boron ion species from other species to be implanted. Specifically, the mass analyzer/filter 405 is arranged to permit only the targeted active boron ions to travel onwards into the process chamber or end station 410. The boron ion beam 407 can then be accelerated/decelerated by acceleration/deceleration unit 406 as required and then transported to the surface of a wafer or target workpiece 409 positioned in an end station 410 for implantation of the active boron ions into the workpiece 409. The active boron ions of the beam collide with and penetrate into the surface of the workpiece 409 at the desired depth to form a region with the desired electrical and physical properties. By employing the process and techniques of this invention, the beam current of the ion source apparatus 300 included within system 400 can be significantly increased over conventional boron ion dopant systems without incurring a drop in ion source life. As such, the present invention represents an advancement in the boron ion implantation industry which, among other process benefits, increases throughput of the ion source apparatus 400.

It should be noted many variations in the structure and design of the boron ion implant process 400 may be employed in different embodiments of the present invention. Furthermore, the details of the construction and design are not important in the performance of the present invention, except insofar as they relate to the boron-containing dopant composition used in the ion source apparatus 300 and corresponding implant process 400.

Additionally, the ion source apparatus 300 can include any of the commonly used ion sources in commercial ion implanters, such as Freeman and Bernas type sources, indirectly heated cathode sources and RF plasma sources. The ion source operating parameters including pressure, filament current and arc voltage, are tuned to achieve desired ionization of the boron-containing dopant gas composition comprising B2H6 and BF3 such that under the selected parameters, the B2H6 possesses a higher ionization cross-section compared to BF3, thereby enhancing ionization and generation of active B ions in accordance with principles of the present invention.

Applicants have performed several experiments to compare the boron-containing dopant gas compositions of the present invention with other dopant gas materials, as will now be discussed in the Examples below. It should be noted that for all tests described below, the ion source filament weight gain or loss and the anode weight gain or weight loss were each measured by taking weight measurements of the ion source filament before and after the test as known in the art. The current was measured using a Faraday cup by standardized techniques well known in the art. Source parameters of arc current, arc voltage, extraction voltage and source pressure were maintained the same for all the experiments.

COMPARATIVE EXAMPLE 1

11BF3

Figure 5:
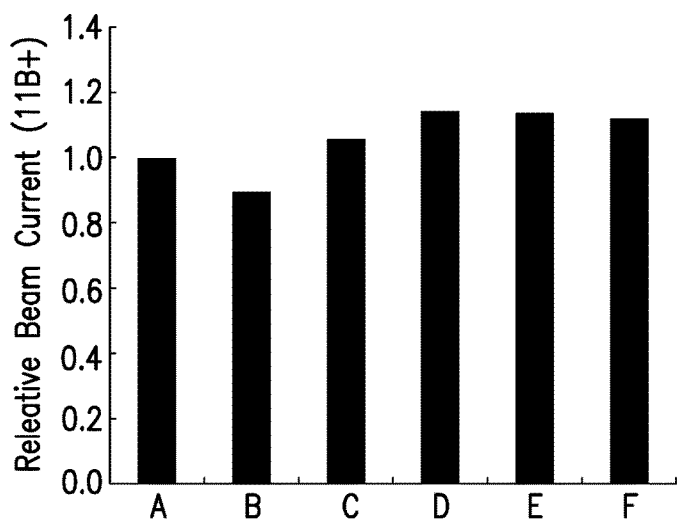
FIG. 5 is a comparison of beam current levels of the dopant gas composition of the present inventions with other types of boron-based dopant gas materials.

An ionization test was performed to evaluate ion beam performance of an ion beam derived from a dopant gas composition of 11BF3 only (i.e., designated as sample "A" in FIG. 5). The interior of the chamber consisted of an ion source that was constructed to include a helical filament and anode situated perpendicular to an axis of the helical filament. A substrate plate was positioned in front of the anode to keep the anode stationary during the ionization process. The 11BF3 was introduced into the ion source chamber. Voltage was applied to the ion source to ionize the 11BF3 and produce boron ions. The beam current that was measured is shown in FIG. 5.

It was observed that the filament gained weight at a rapid rate and adversely impacted the life time of ion source. In addition, material accumulated in undesirable locations in the ion source. Most of this accumulated deposit consisted of W. This accumulation was attributed to fluorine ions/radicals formed due to dissociation of $11BF_3$ during ionization in the ion source chamber.

The beam current was considered acceptable for purposes of generating a well-defined boron ion beam that could be used for ion implantation, and as such is normalized to a value of 1.0 against which other tests would be compared. However, a significant cathode filament weight gain rate of 28.5 mg/hr was observed as shown in FIG. 6. The accumulation of various W-containing deposits on the filament during the test reduced its thermionic emission rate resulting in eventual loss of beam current due to insufficient ionization of the source gas, which required the test to be aborted. These results were believed to be typical of problems encountered with utilizing solely 11BF3 as the B ion dopant source.

COMPARATIVE EXAMPLE 2

11BF3+Xe/H2

An ionization test was performed to evaluate the ion beam current obtained from a dopant gas composition in the chamber composed of a mixture of 2.25% Xe+12.75% H2+85% 11BF3 (i.e., designated as sample "B" in FIG. 5). The same ion source chamber was utilized as when performing the baseline test in Comparative Example 1. The 11BF3 was introduced into the chamber as a separate source, and the diluent xenon/hydrogen was introduced from another source into the ion source chamber. The 11BF3 and the xenon/hydrogen were introduced in the required amounts to produce the dopant gas composition of 2.25% Xe+12.75% H2+85% 11BF3 within the chamber.

Voltage was applied to the ion source to ionize the dopant composition and produce boron ions. Beam current was normalized against that of 11BF3 from Comparative Example 1 and is shown in FIG. 5. The beam current for Sample B was measured and determined to be about 15% lower than that produced with utilizing only 11BF3, as shown in FIG. 5. A rate of weight gain of 1.43 mg/hr of the cathode filament and a rate of weight loss of −0.75 mg/hr of the anode region were obtained as shown in Table 1. The rate of weight gain of the filament due to deposits was significantly less than that of 11BF3 from Comparative Example 1, indicating less active F ions were available to sustain the halogen cycle and etch additional tungsten chamber components. As a result, the halogen cycle was reduced relative to that of Comparative Example 1. Less beam glitching occurred relative to Comparative Example 1. However, the xenon/hydrogen diluent reduced the halogen cycle and W-containing deposits at the expense of generating a beam current lower than that of utilizing solely 11BF3 (FIG. 3). These results were indicative of conventional boron-containing dopant gas precursors using a diluent gas mixture.

COMPARATIVE EXAMPLE 3

97.5% 11BF3+2.5% B2H6

An ionization test was performed to evaluate the ion beam current obtained from a dopant gas composition in the chamber composed of a mixture of 97.5% 11BF3+2.5% B2H6 (i.e., designated as sample "C" in FIG. 5). Pure 11BF3 was flowed from one source, and a mixture of 5% B2H6–11BF3 was flowed from another source. The constituents were introduced into the chamber to form a composition comprising 97.5% 11BF3+2.5% B2H6. The same ion source chamber was utilized as when performing the tests in Comparative Examples 1 and 2.

Voltage was applied to the ion source to ionize the dopant gas mixture and produce boron ions. Beam current was measured and normalized against that of 11BF3, as shown in FIG. 5. The beam current was determined to be higher than either Comparative Examples 1 or 2. However, a rate of weight gain of 0.3 mg/hr of the cathode filament was obtained as shown in FIG. 6. Additionally, a rate of weight loss of −5.1 mg/hr in the anode region was obtained. The rates of weight gain of the cathode filament and weight loss in the anode region collectively indicated unacceptable shortened ion source life. These results were indicative of conventional boron-containing dopant gas mixtures.

COMPARATIVE EXAMPLE 4

5% B2H6+95% 11BF3

An ionization test was performed to evaluate the ion beam current obtained from a dopant gas composition in the chamber composed of a mixture of 95% 11BF3+5% B2H6 (i.e., designated as sample "D" in FIG. 5). The same ion source chamber was utilized as when performing the tests in Comparative Examples 1, 2 and 3. The dopant gas composition was pre-mixed and introduced from a single source into the chamber.

Voltage was applied to the ion source to ionize the dopant gas composition and produce boron ions. Beam current was measured and normalized against that of 11BF3. The beam current was determined to be higher than Comparative Examples 1, 2 and 3.

Source life data was not collected, as it was expected that Sample D would exhibit a source life equivalent to or worse than the source life of Sample C, which was already determined to be unacceptable.

EXAMPLE 1

5% B2H6+5% H2+90% 11BF3

An ionization test was performed to evaluate the ion beam current obtained from a boron-containing dopant gas composition in the chamber composed of 5% B2H6+5% H2+90% 11BF3 (i.e., designated as sample "E" in FIG. 5). The same ion source chamber was utilized as when performing the tests of Comparative Examples 1, 2, 3 and 4. The composition was pre-mixed into a single delivery vessel and delivered therefrom to the ion source chamber.

Voltage was applied to the ion source to ionize the boron dopant gas composition and produce boron ions. Beam current was measured and normalized against that of 11BF3 (Comparative Example 1). Beam current was determined to be higher than that produced when utilizing the 11BF3.

A rate of weight loss of −2.5 mg/hr of the cathode filament and −1.1 mg/hr in the anode region was obtained as shown in FIG. 6. This sample exhibited less weight change than any of the Comparative Examples. This composition produced increased beam current and sustained the higher beam current without shortening the ion source life.

EXAMPLE 2

3% B2H6+5% H2+92% 11BF3

An ionization test was performed to evaluate the ion beam current obtained from a boron-containing dopant gas composition composed of 3% B2H6+5% H2+92% 11BF3 (i.e., designated as sample "F" in FIG. 5). The same ion source chamber was utilized as when performing the tests of Comparative Examples 1, 2, 3 and 4. The composition was pre-mixed into a single delivery vessel and delivered therefrom to the ion source chamber.

Voltage was applied to the ion source to ionize the boron dopant gas composition and produce boron ions. Beam current was measured and normalized against that of 11BF3 (Comparative Example 1). Beam current was determined to be higher than that produced when utilizing 11BF3.

A rate of weight loss of −0.6 mg/hr of the cathode filament and −0.9 mg/hr in the anode region was observed, as shown in FIG. 6. These source life data values indicate that the composition of Sample F was able to sustain the higher beam current without shortening ion source life.

Examples 1 and 2 demonstrated an increased quality in the ion beam relative to the Comparative Examples 1-4. The invention demonstrates that the etching of W-containing chamber components is significantly reduced when using the boron-containing dopant gas composition of the present invention. Reduction of deposits reduces or eliminates beam instability and eventual beam glitching, thereby improving the boron beam current during source life of the ion chamber. Furthermore, unlike prior art methods, the compositions, systems and methods of use thereof for the present invention can increase the beam current without compromising, degrading or shortening the ion source life. Increased quality of boron beam current coupled with extended ion source can increase throughput and provides an opportunity for reducing cycle time to achieve the required dopant dosage of the process workpieces.

From an ionization standpoint, Examples 1 and 2 also demonstrate that specific boron-containing compositions of the present invention can generate boron active ions and an increased beam current without degradation of the ion source. In particular, a mixture of B2H6, BF3 and H2 within preferred concentration ranges of the present invention at selected arc voltage operating conditions facilitates interaction with one another in a synergistic manner to create a boron ionization mechanism which can generate an increased amount of active boron ions at least about equal to the simple additive effect of total boron ions available from individually ionizing B2H6 and BF3. The net effect is an improvement of the boron beam current in comparison to conventional systems and processes employing conventional boron precursor materials.

Additionally, the present invention can overcome the drawbacks of conventional boron ion implant systems and methods which require a diluent gas mixture such as Xe/H2 for the purpose of reducing deposits. Diluent gas mixtures tend to reduce the active number of boron ions available per unit gas flow into the ion source chamber, thereby reducing throughput. Accordingly, this so-called "dilution effect" typically encountered with conventional boron dopant compositions employing a diluent gas mixture is eliminated in the present invention, as the present invention does not rely on incorporation of a diluent gas mixture for extending source life.

The present invention also offers other process benefits. For example, the increased beam current attainable in the present invention can eliminate the requirement of any additional gas stick (e.g., flow control device, pressure monitoring device, valves and electronic interface), and therefore offers a significant reduction in capital expense associated with utilizing additional gas sticks.

While it has been shown and described what is considered to be certain embodiments of the invention, it will, of course, be understood that various modifications and changes in form or detail can readily be made without departing from the spirit and scope of the invention. It is, therefore, intended that this invention not be limited to the exact form and detail herein shown and described, nor to anything less than the whole of the invention herein disclosed and hereinafter claimed.

The invention claimed is:

1. A dopant gas composition comprising:
    a boron-containing dopant gas composition comprising diborane (B2H6) at a level ranging from about 0.1%-10%, H$_2$ ranging from about 5%-15% and the balance is BF$_3$, wherein said B2H6 is selected to have a ionization cross-section higher than that of said BF3 at an operating arc voltage of an ion source utilized during generation and implantation of active boron ions;
    wherein said boron-containing dopant gas composition increases boron ion beam current and extends ion source life in comparison to a beam current generated from boron trifluoride (BF3).

2. The dopant gas composition of claim 1, wherein said B2H6 is at about 2-5%, said H2 is at a level ranging from about 5-10% and the balance is BF3.

3. The dopant composition of claim 1, wherein said B2H6, said H2 and balance BF3 is supplied from a single storage and delivery source.

4. The dopant composition of claim 1, wherein said B2H6 and BF3 are supplied in separate storage and delivery sources so as to create the boron-containing dopant composition within a chamber of said ion source.

5. The dopant composition of claim 1, wherein said boron-containing gas composition is characterized by the absence of an inert gas.

6. A system for providing an improved beam current during boron ion implantation, comprising:
    an ion source apparatus partially defined by an arc chamber wall, wherein the chamber comprises a boron ion source disposed at least partially within the chamber wall;
    one or more supply vessels in fluid communication with said ion source apparatus, said vessels storing a boron-containing dopant gas composition, said composition comprising $B_2H_6$ at a level ranging from about 0.1%-10%, $H_2$ ranging from about 5%-15% and the balance is $BF_3$, wherein said $B_2H_6$ is selected to have a ionization cross-section higher than that of said $BF_3$ at an operating arc voltage of an ion source utilized during generation and implantation of active boron ions;

one or more supply feed lines corresponding to the one or more supply vessels, said feed lines extending from the one or more supply vessels through the wall into the chamber;

said one or more vessels configured to dispense said boron-containing dopant composition through said supply feed lines and into said ion source apparatus thereby allowing the boron-containing composition to ionize and thereby generate active boron ions;

wherein the active boron ions produce an increased beam current in comparison to a beam current generated solely from $BF_3$.

7. The system of claim 6, wherein said wherein said $B_2H_6$ is at about 2-5%, said $H_2$ is at a level ranging from about 5-10% and the balance is $BF_3$.

8. The system of claim 6, wherein a first supply vessel and a second supply vessel are provided as part of a gas kit, said first supply vessel comprising $B_2H_6$ in combination with $H_2$, and said second supply vessel comprising $BF_3$, each of said first and second supply vessel dispensing $B_2H_6$, $H_2$ and $BF_3$, respectively, to the ion source chamber at controlled flow rates to produce a boron-containing dopant composition within the chamber wherein said $B_2H_6$ is at about 2-5%, said $H_2$ is at a level ranging from about 5-10% and the balance is $BF_3$.

9. The system of claim 8, wherein said gas kit comprises a first flow controller for regulating flow of said $B_2H_6$ and said $H_2$ at a first flow rate from said first supply vessel, and said kit further comprises a second flow controller for regulating flow of said $BF_3$ at a second flow rate from said second supply vessel.

10. The system of claim 6, wherein a single supply vessel is pre-mixed with the boron-containing dopant gas composition, and further wherein said supply vessel is a sub-atmospheric storage and delivery vessel.

11. A method for increasing a quality of an ion beam current during boron ion implantation, comprising:

introducing a boron-containing dopant composition into an ion source chamber, said boron-containing dopant composition comprising $B_2H_6$ at a level ranging from about 0.1%-10%, $H_2$ ranging from about 5%-15% and the balance as $BF_3$;

ionizing said $B_2H_6$ and said $BF_3$ at a predetermined operating arc voltage at which said $B_2H_6$ has an ionization cross-section higher than that of said $BF_3$;

generating active boron ions; and producing an increased beam current having an extended source life in comparison to a beam current generated solely from $BF_3$.

12. The method of claim 11, wherein said boron-containing dopant composition is characterized by an absence of an inert gas.

13. The method of claim 11, wherein a first supply vessel and a second supply vessel are provided as part of a gas kit, said first supply vessel comprising $B_2H_6$ in combination with $H_2$, and said second supply vessel comprises $BF_3$, said first vessel dispensing $B_2H_6$ and $H_2$, and said second vessel dispensing said $BF_3$ to the ion source chamber at controlled flow rates in a co-flowed or sequentially flowed manner to produce the boron-containing dopant composition within the chamber.

14. The method of claim 11, wherein said predetermined operating arc voltage ranges from about 80 V-120 V.

15. The method of claim 11, wherein a single supply vessel dispenses said boron-containing dopant composition into said chamber.

16. The dopant gas composition of claim 1, wherein at least one of said $B_2H_6$ and said $BF_3$ is isotopically enriched.

17. The system of claim 6, wherein at least one of said $B_2H_6$ and said $BF_3$ is isotopically enriched.

18. The method of claim 11, wherein at least one of said $B_2H_6$ and said $BF_3$ is isotopically enriched.

* * * * *